United States Patent
Drost et al.

(10) Patent No.: US 8,482,072 B2
(45) Date of Patent: Jul. 9, 2013

(54) SEMICONDUCTOR DIE WITH INTEGRATED ELECTRO-STATIC DISCHARGE DEVICE

(75) Inventors: Robert J. Drost, Los Altos, CA (US); Robert D. Hopkins, Hayward, CA (US); Alex Chow, Palo Alto, CA (US)

(73) Assignee: Oracle America, Inc.

( * ) Notice: Subject to any disclaimer, the term of this patent is extended or adjusted under 35 U.S.C. 154(b) by 0 days.

(21) Appl. No.: 13/473,479

(22) Filed: May 16, 2012

(65) Prior Publication Data
US 2012/0229941 A1 Sep. 13, 2012

Related U.S. Application Data

(62) Division of application No. 12/580,658, filed on Oct. 16, 2009, now Pat. No. 8,183,593.

(51) Int. Cl.
| | |
|---|---|
| H01L 23/62 | (2006.01) |
| H01L 29/72 | (2006.01) |
| H01L 29/74 | (2006.01) |
| H01L 31/111 | (2006.01) |
| H01L 29/73 | (2006.01) |

(52) U.S. Cl.
USPC .... 257/355; 257/173; 257/174; 257/E23.002; 257/E23.013

(58) Field of Classification Search
USPC ........... 257/173, 174, 355, E23.002, E23.013
See application file for complete search history.

(56) References Cited

U.S. PATENT DOCUMENTS

| | | | |
|---|---|---|---|
| 5,731,223 A | 3/1998 | Pandmanabhan | |
| 5,933,718 A * | 8/1999 | El-Kareh et al. | 438/200 |
| 5,936,284 A * | 8/1999 | Ravanelli | 257/361 |
| 5,990,519 A * | 11/1999 | Huang-Lu et al. | 257/357 |
| 6,117,299 A | 9/2000 | Rinne et al. | |
| 6,610,262 B1 | 8/2003 | Peng et al. | |
| 6,682,993 B1 | 1/2004 | Wu et al. | |
| 7,364,931 B2 * | 4/2008 | Ito | 438/48 |
| 7,608,910 B2 * | 10/2009 | Eun | 257/529 |
| 7,768,082 B2 * | 8/2010 | Nagai | 257/417 |
| 7,903,379 B2 | 3/2011 | Chaine et al. | |
| 7,973,365 B2 | 7/2011 | Hodel et al. | |
| 8,080,442 B2 | 12/2011 | Leedy | |
| 8,294,230 B2 * | 10/2012 | Yamagata et al. | 257/435 |
| 2004/0089909 A1 | 5/2004 | Lee et al. | |
| 2005/0247979 A1 | 11/2005 | Fung | |
| 2006/0065931 A1 | 3/2006 | Lee et al. | |

(Continued)

OTHER PUBLICATIONS

Chun, Jung-Noon et al. "EDS Protection Circuits for Advanced CMOS Technologies", Stanford University, Jun. 2006.

(Continued)

*Primary Examiner* — Ida M Soward
(74) *Attorney, Agent, or Firm* — Park, Vaughan, Fleming & Dowler, LLP; Anthony P. Jones

(57) ABSTRACT

A semiconductor die is described. This semiconductor die includes an electro-static discharge (ESD) device with a metal component coupled to an input-output (I/O) pad, and coupled to a ground voltage via a signal line. Moreover, adjacent edges of the metal component and the I/O pad are separated by a spacing that defines an ESD gap. When a field-emission or ionization current flows across the ESD gap, the metal component provides a discharge path to the ground voltage for transient ESD signals. Furthermore, the ESD gap is at least partially enclosed so that there is gas in the ESD gap.

20 Claims, 10 Drawing Sheets

U.S. PATENT DOCUMENTS

| | | | |
|---|---|---|---|
| 2006/0126254 A1* | 6/2006 | Auriel et al. | 361/118 |
| 2006/0237766 A1* | 10/2006 | Ahn | 257/314 |
| 2006/0250744 A1* | 11/2006 | McTigue et al. | 361/120 |
| 2009/0111235 A1 | 4/2009 | Clevenger et al. | |
| 2009/0284883 A1 | 11/2009 | Lee et al. | |
| 2010/0187652 A1 | 7/2010 | Yang | |

OTHER PUBLICATIONS

Kelly, M.A. et al., "An Investigation of Human Body Electrostatic Discharge", ISTFA '93: The 19th International Symposium for Testing & Failure Analysis, Los Angeles, CA USA/Nov. 15-19, 1993, pp. 167-173.

Voldman, S. et al., "A Strategy for Characterization and Evaluation of ESD Robustness of CMOS Semiconductor Technologies", SEMATECH ESD Technology Working Group, EOS/ESD Symposium, 99-212, IEEE May 2009, pp. 3A.4.1-3A.4.13.

* cited by examiner

SEMICONDUCTOR DIE WITH INTEGRATED ELECTRO-STATIC DISCHARGE DEVICE

RELATED APPLICATIONS

The instant application is a divisional application of, and hereby claims priority under 35 U.S.C. §120 to, pending U.S. patent application Ser. No. 12/580,658, titled "Semiconductor Die with Integrated Electro-Static Discharge Device," by inventors Robert J. Drost, Robert D. Hopkins, and Alex Chow, which was filed on Oct. 16, 2009, and which is incorporated by reference.

BACKGROUND

1. Field

The present disclosure relates to a semiconductor die that includes an integrated electro-static discharge (ESD) device to protect the semiconductor die from transient ESD signals.

2. Related Art

ESD events commonly arise during the manufacture, assembly or use of systems containing integrated circuits. While the amount of energy dissipated during an ESD event may be comparatively small on a human scale (akin to the shock you receive when touching a metal object after walking across a thick carpet), from the perspective of the small, sensitive electronics on an integrated circuit, the destructive power can be comparable to a lightning strike, and can cause significant damage to integrated circuits.

A variety of existing ESD-protection circuits and techniques are used to protect integrated circuits from ESD events. For example, one existing ESD-protection circuit includes reverse-biased metal-oxide-semiconductor (MOS) or PN diodes that turn on during an ESD event. However, when sized to safely absorb an ESD event, this ESD-protection circuit can significantly increase the parasitic capacitance of the input/output (I/O) pads in an integrated circuit. This increase in parasitic capacitance is problematic because it can: reduce edge rates by introducing inter-symbol-interference (ISI); cause reflections; and cause near-end or far-end crosstalk. These problems can significantly reduce the maximum data rate that can be communicated through I/O channels. Furthermore, parasitic capacitance consumes power as signals charge and discharge the additional load.

Additionally, the parasitic capacitance introduced by existing ESD-protection circuits (such as MOS transistors, PN junctions, or N-well resistors) is typically a nonlinear function of the transient ESD signal amplitude. This nonlinearity further deteriorates the I/O pad's termination properties for high-speed signaling, and introduces distortion in analog-to-digital (A2D) converters that limits their conversion accuracy.

Hence, what is needed is an ESD-protection circuit without the problems described above.

SUMMARY

One embodiment of the present disclosure provides a semiconductor die that includes: a substrate, a first layer deposited on the substrate, and a second layer deposited on the first layer. The first layer includes an ESD device with at least a metal component coupled to an I/O pad, and coupled to ground via a signal line. Moreover, adjacent edges of the metal component and the I/O pad are separated by a spacing that defines an ESD gap. When a field-emission or ionization current flows across the ESD gap, the metal component provides a discharge path to ground for transient ESD signals. Furthermore, the second layer at least partially encloses the ESD gap between the metal component and the I/O pad, thereby providing a gas in the ESD gap.

In some embodiments, a surface of the second layer and a surface of the substrate define a cavity that fully encloses the ESD gap. Alternatively, the second layer may include an opening, defined in part by a surface of the second layer, which exposes the ESD gap to the gas. Furthermore, the gas in the cavity may be air or other than air.

Note that at least one of the adjacent edges may have an arrow shape in a plane of the first layer. In some embodiments, the adjacent edges both have an arrow shape in a plane of the first layer, and the spacing that defines the ESD gap is between tips of the arrow-shaped adjacent edges.

In some embodiments, the semiconductor die includes a third layer between the substrate and the first layer which is underneath at least the ESD gap. For example, the third layer may include a dielectric. This dielectric and/or the spacing may be used to select a turn-on voltage of the ESD device during design.

Additionally, the semiconductor die may include multiple ESD devices in the first layer, where the metal component in a given one of the ESD devices is coupled to a corresponding I/O pad, and is coupled to ground via the signal line. For example, the ESD devices may be arranged in: a 1-dimensional array along the signal line in the first layer or a 2-dimensional array in the first layer. Furthermore, the turn-on voltage of the given ESD device may be in one of at least two ranges of voltages, which are separated by a threshold voltage. Note that a size of the given ESD device may correspond to the turn-on voltage.

In some embodiments, the semiconductor die includes an ESD diode, which is coupled in parallel with the ESD device. For example, a low-pass filter may couple the ESD device and the ESD diode. Note that the ESD device may have a lower capacitance than the ESD diode.

Another embodiment provides a chip package that includes the semiconductor die.

Another embodiment provides an electronic device that includes the chip package.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a semiconductor die, a chip package that includes the semiconductor die, and an electronic device that includes the chip package are described. This semiconductor die includes an ESD device with a metal component coupled to an I/O pad, and coupled to ground via a signal line. Moreover, adjacent edges of the metal component and the I/O pad are separated by a spacing that defines an ESD gap. When a field-emission or ionization current flows across the ESD gap, the metal component provides a discharge path to ground for transient ESD signals. Furthermore, the ESD gap is at least partially enclosed so that there is gas in the ESD gap.

Relative to existing ESD-protection circuits, the ESD device: absorbs or dissipates more energy, has less parasitic capacitance, and has a more linear response. Consequently, the ESD device provides improved protection from ESD events, and offers improved performance in high-speed circuits or in circuits with precision signals.

We now describe embodiments of a semiconductor die. An ESD event has two locations on a chip or semiconductor die: one into which an ESD current enters the semiconductor die, and one from which the current leaves the semiconductor die. For most semiconductor dies, the wires and circuits are covered with a protective insulating layer called the passivation. Typically, only the I/O pads of the semiconductor die are exposed to air by etching an opening in the passivation over the I/O pads. In order to protect the wires and circuits on the semiconductor die, ESD-protection circuits provide an alternative path for the ESD current between any pair of I/O pads.

Figure 1A:
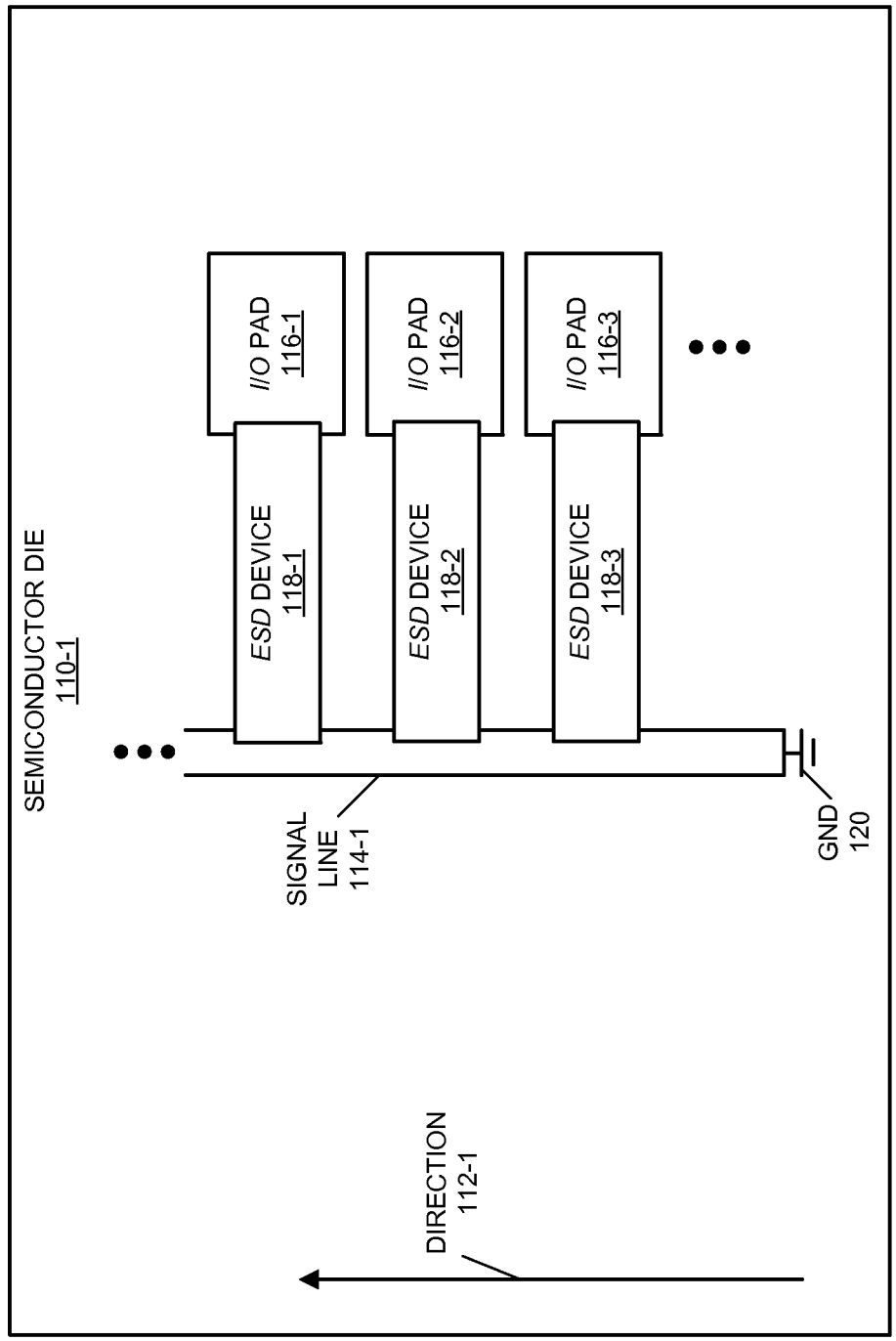
FIG. 1A is a block diagram illustrating a semiconductor die in accordance with an embodiment of the present disclosure.

One configuration for protecting a semiconductor die 110-1 is shown in FIG. 1A. This semiconductor die includes one or more I/O pads 116 arranged along a direction 112-1. These I/O pads 116 are electrically coupled to signal line 114-1, and to ground (GND) 120, by corresponding ESD devices 118.

As described further below with reference to FIGS. 2A-2E, each of ESD devices 118, such as ESD device 118-1, includes a metal-gas-metal structure that serves to absorb an ESD event, and that has better cost and performance characteristics than the semiconductor devices in existing ESD-protection circuits. During an ESD event, the gas in the ESD gap between the two metal terminals switches from being an insulator to a conductor by a field-emission process and/or ionization-current (or gaseous-breakdown) process. In the conductive mode, the energy from the ESD event is effectively and efficiently transferred between metal terminals and away from sensitive electronic circuits on semiconductor die 110-1 (not shown). On the other hand, during normal operation the gas in the ESD gap insulates the metal terminals, and the resulting parasitic capacitance is much lower (and the response is more linear) than that of semiconductor devices in existing ESD-protection circuits, such as: MOS transistors, PN diodes, and N-well resistors.

Figure 1B:
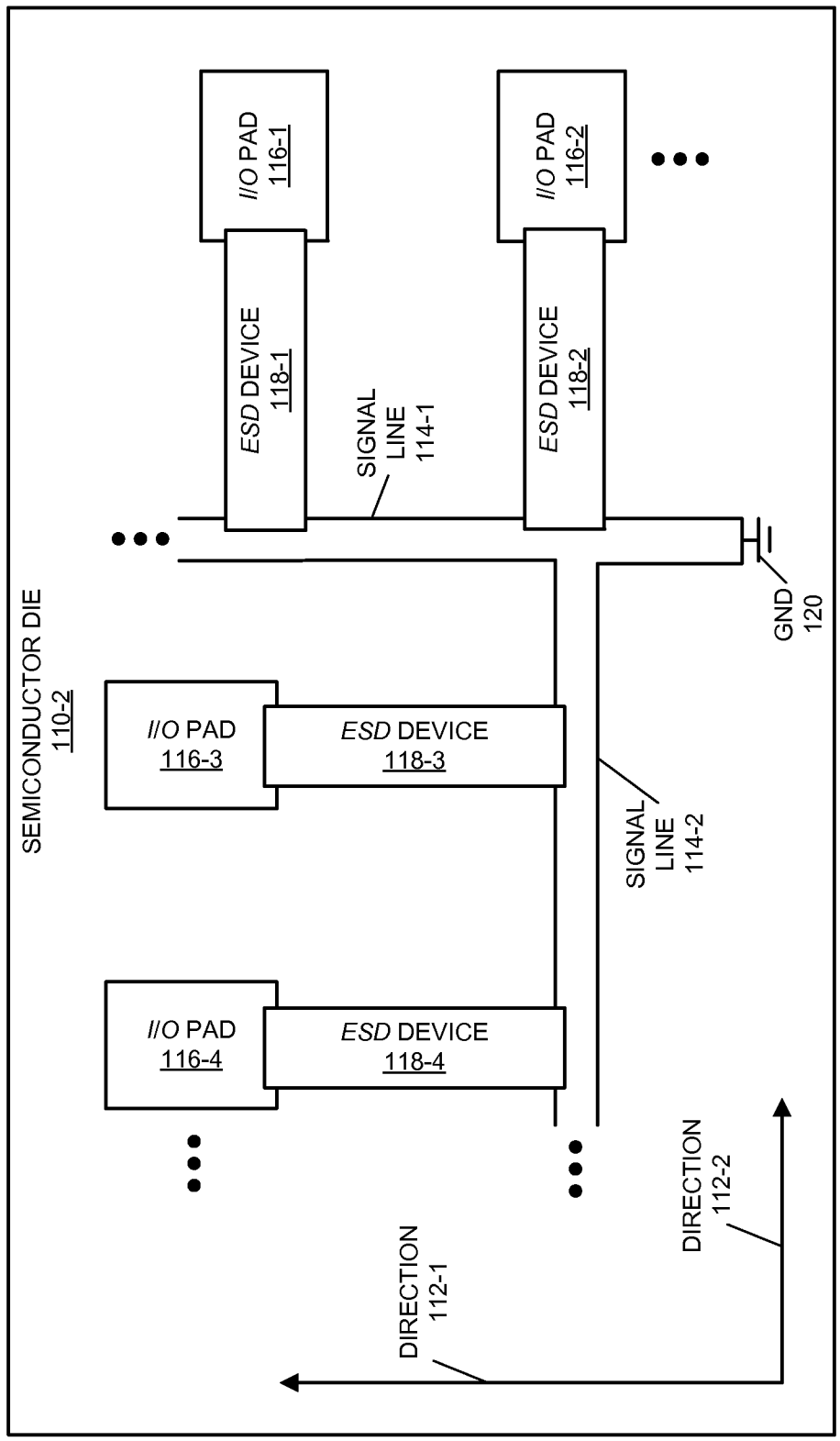
FIG. 1B is a block diagram illustrating a semiconductor die in accordance with an embodiment of the present disclosure.

Note that the metal path in ESD devices 118 may be used for another purpose as well (such as a power, ground or signal rail) because, during normal operation, the ESD gaps in all of ESD devices 118 are insulating. As shown in FIG. 1B, in some embodiments semiconductor die 110-2 includes I/O pads 116 and ESD devices 118 that are arranged in a 2-dimensional array along directions 112. In this configuration, signals lines 114 provide a continuous metal path that passes near each of I/O pads 116. Typically, power or ground wiring naturally has this property. Furthermore, ESD devices 118 electrically couple the signal lines 114 to corresponding I/O pads 116.

Figure 2A:
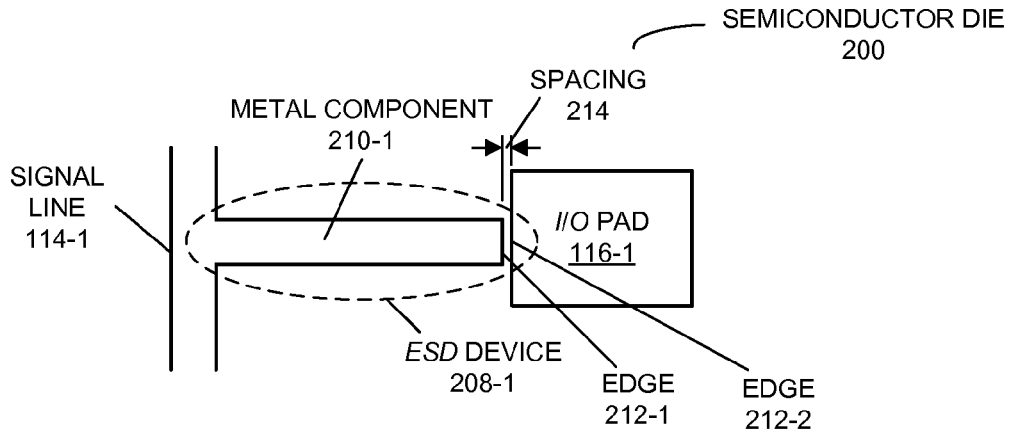
FIG. 2A is a block diagram illustrating an electro-static discharge (ESD) device on a semiconductor die in accordance with an embodiment of the present disclosure.

We now describe a number of ways to construct the ESD gap in ESD devices 118. FIG. 2A presents a block diagram illustrating an ESD device 208-1 on a semiconductor die 200. In this ESD device, metal component 210-1 is coupled to I/O pad 116-1 (and is coupled to ground via signal line 114-1). In particular, adjacent edges 212 of metal component 210-1 and I/O pad 116-1 are separated by a spacing 214 that defines an ESD gap (such as a micron spark gap). Note that, when a field-emission or ionization current flows across the ESD gap, metal component 210-1 provides a discharge path to ground for transient ESD signals.

Figure 2B:
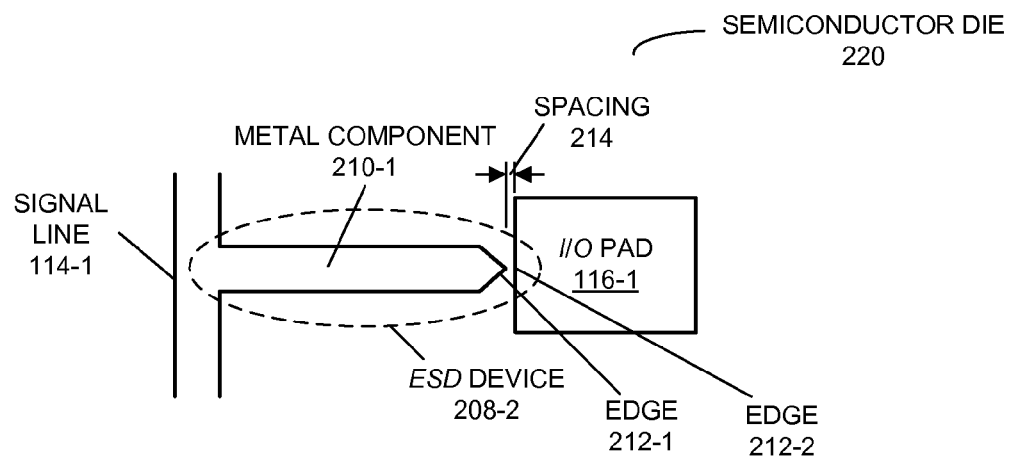
FIG. 2B is a block diagram illustrating an ESD device on a semiconductor die in accordance with an embodiment of the present disclosure.
Figure 2C:
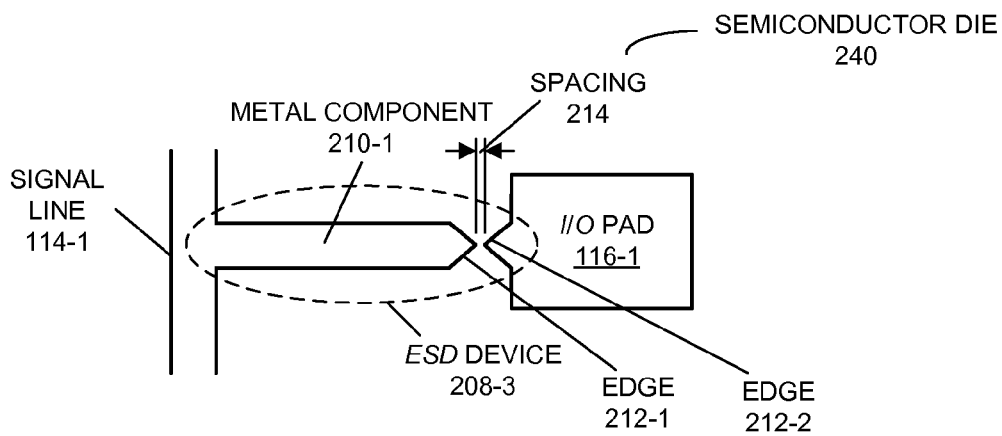
FIG. 2C is a block diagram illustrating an ESD device on a semiconductor die in accordance with an embodiment of the present disclosure.

In some embodiments, at least one of adjacent edges 212 may have an arrow shape, such as a sharp tip. This is shown in FIG. 2B, which presents a block diagram illustrating an ESD device 208-2 on a semiconductor die 220. By narrowing the ESD gap as it approaches I/O pad 116-1, the sharp end of metal component 210-1 may reduce the dielectric strength of the gas in the ESD gap and, therefore, may improve the field-emission effect. Furthermore, the parasitic capacitance between the narrow tip and I/O pad 116-1 is lower than that of edges 212 in FIG. 2A. Note that the narrowness of metal component 210-1 and the sharp tip in FIG. 2B may be limited by the current carrying capability of the metal layer in semiconductor die 220. For example, a typical specification for reliable operation of a metal wire in an integrated-circuit process supports a sustained current of one mA/µm for normal operation and one A/µm for an ESD event. Metal component 210-1 in ESD device 208-2 may be wide enough and/or thick enough to support the current flow associated with an ESD event without prematurely breaking open due to a limited current-carrying capability.

In some embodiments, adjacent edges 212 both have an arrow shape in a plane of metal component 210-1, and spacing 214, which defines the ESD gap, is between tips of the arrow-shaped adjacent edges. This is shown FIG. 2C, which presents a block diagram illustrating an ESD device 208-3 on a semiconductor die 240. This configuration may further: lower the dielectric strength of the gas in the ESD gap, increase the field-emission effect, reduce the breakdown voltage, and lower the parasitic capacitance across the ESD gap.

Figure 2D:
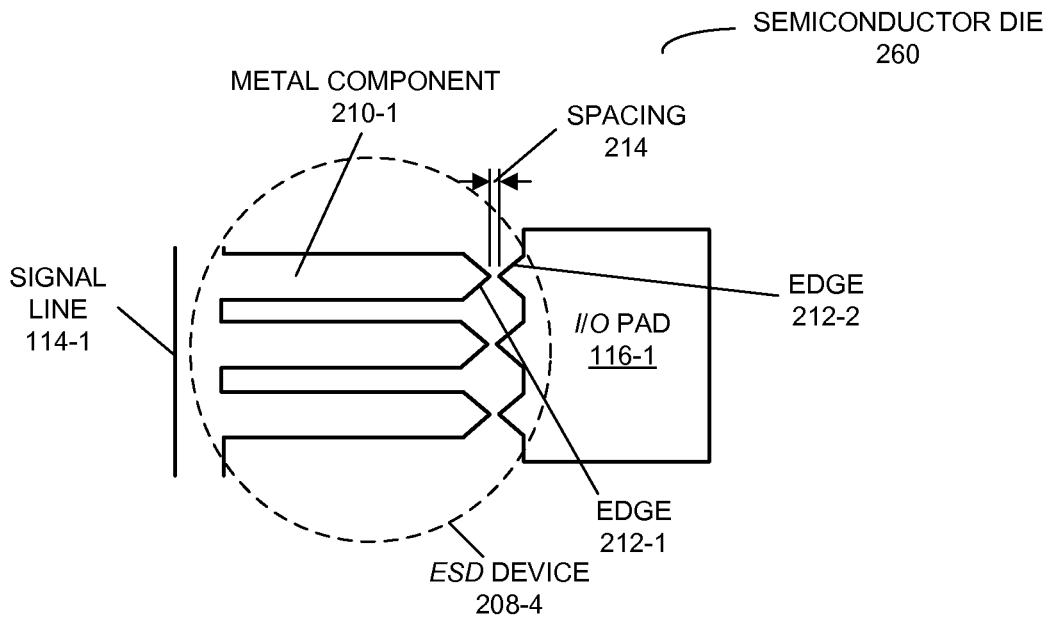
FIG. 2D is a block diagram illustrating an ESD device on a semiconductor die in accordance with an embodiment of the present disclosure.

In some embodiments, an ESD device includes a number of paired sharp tips. This is shown in FIG. 2D, which presents a block diagram illustrating an ESD device 208-4 on a semiconductor die 260. This configuration may increase the ability of ESD device 208-4 to protect semiconductor die 260 from repeated ESD events. For example, each event may damage the local area of ESD device 208-4 that carried the highest concentration of current by causing some metal in metal component 210-1 and/or I/O pad 116-1 to overheat and migrate, which results in a local increase in spacing 214. This larger spacing 214 may no longer be protective because the dielectric breakdown voltage may be too high. By including a number of small ESD gaps, ESD device 208-4 can provide backup breakdown paths for repeated ESD events.

Figure 2E:
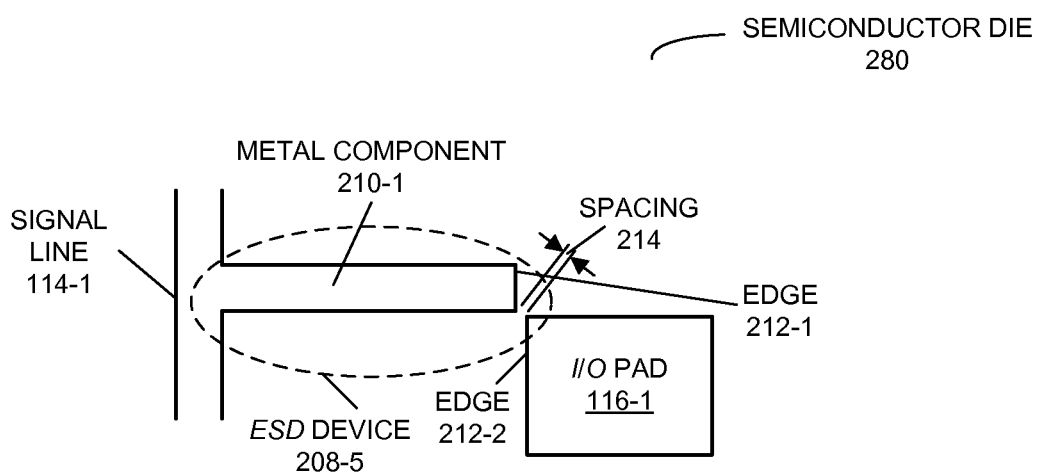
FIG. 2E is a block diagram illustrating an ESD device on a semiconductor die in accordance with an embodiment of the present disclosure.

While several of the preceding embodiments have included a lithographically defined sharp tip, in some embodiments one or more corners of rectangular I/O pad 116-1 and/or metal component 210-1 are used to provide one or more sharp tips. This is shown in FIG. 2E, which presents a block diagram illustrating an ESD device 208-5 on a semiconductor die 280. This configuration provides the benefits of a sharp tip without tapering metal component 210-1 and/or using a non-Manhattan geometry (i.e., a geometry with edges 212 that are other than horizontal and vertical).

Figure 3A:
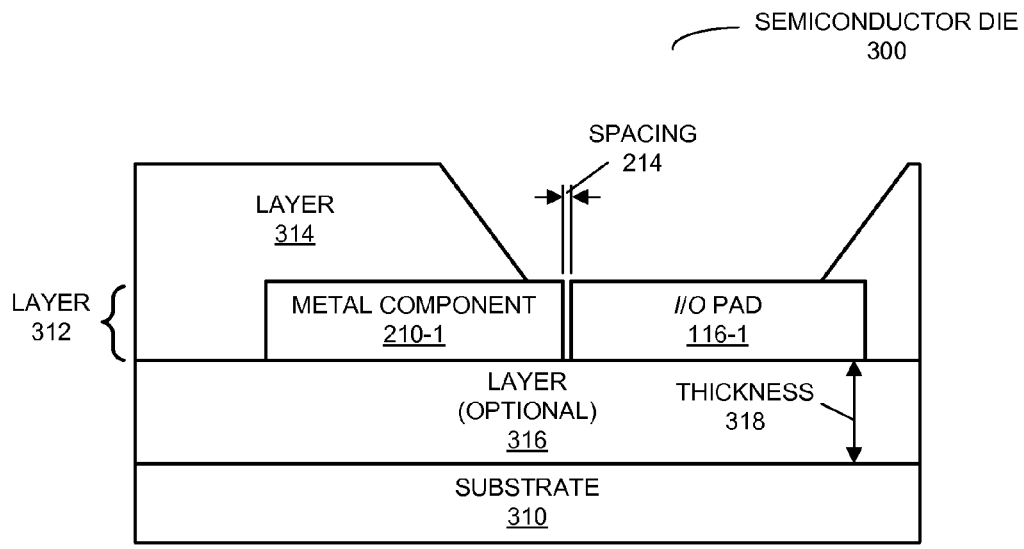
FIG. 3A is a block diagram illustrating a semiconductor die in accordance with an embodiment of the present disclosure.

We now further describe the structure in embodiments of an ESD device. FIG. 3A presents a block diagram illustrating a cross-sectional view of semiconductor die 300. This semiconductor die may include: a substrate 310, a layer 312 deposited on substrate 310, and a layer 314 deposited on layer 312. Layer 312 may include an ESD device. Furthermore, layer 314 at least partially encloses the ESD gap between metal component 210-1 and I/O pad 116-1, thereby providing a gas in the ESD gap. For example, layer 314 may be an encapsulation or passivation layer (such as glass), and metal component 210-1 and I/O pad 116-1 may be at least partially exposed by etching or removing a portion of the passivation layer.

Note that the metal in the ESD device on both metal component 210-1 and I/O-pad 116-1 sides of the ESD gap are exposed to a gas (such as air) so that the ESD gap will break down at the dielectric breakdown voltage of the gas. This is useful because the dielectric strength of solid insulators (such as silicon dioxide) is typically thousands of times higher per micron than a gas, and field emission is strongest in a gas. As a consequence, without the exposed ESD gap, the ESD device would not activate for many ESD events.

Figure 3B:
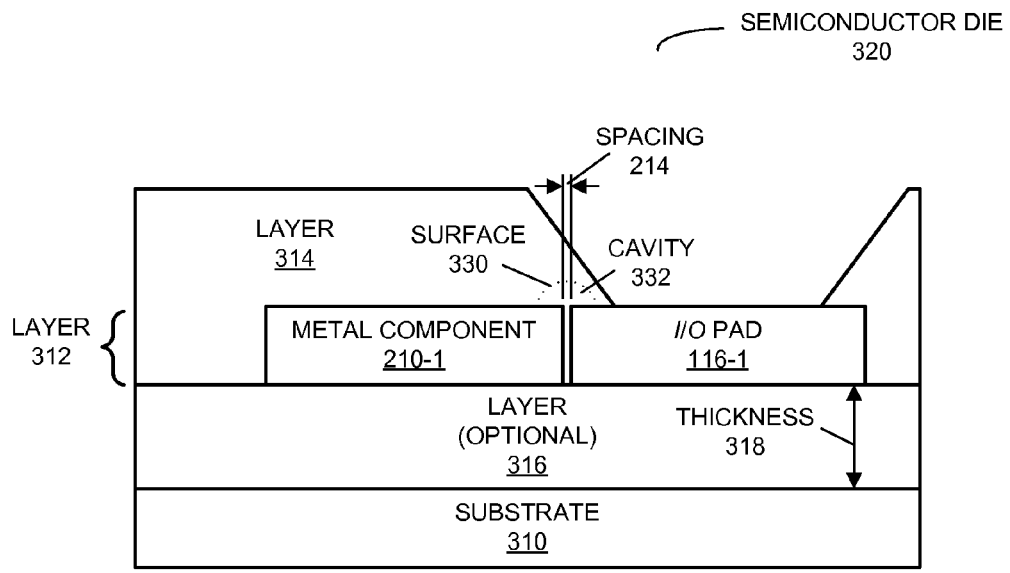
FIG. 3B is a block diagram illustrating a semiconductor die in accordance with an embodiment of the present disclosure.

In some embodiments, a surface of layer 314 and a surface of substrate 310 define a cavity that fully encloses the ESD gap. This is shown in FIG. 3B, which presents a block diagram illustrating a semiconductor die 320. In this semiconductor die, layer 314 may include an opening or cavity 332, defined in part by surface 330, which exposes the ESD gap to the gas. For example, cavity 332 may be formed by the natural gap that occurs when there is a step in the passivation layer. Note that the gas in the cavity may be air or may be other than air. For example, if cavity 332 is hermetically sealed (or has a long diffusion time constant), a gas or an ion may be included in cavity 332 to lower the dielectric strength, and thus the breakdown voltage of the ESD gap.

Figure 3C:
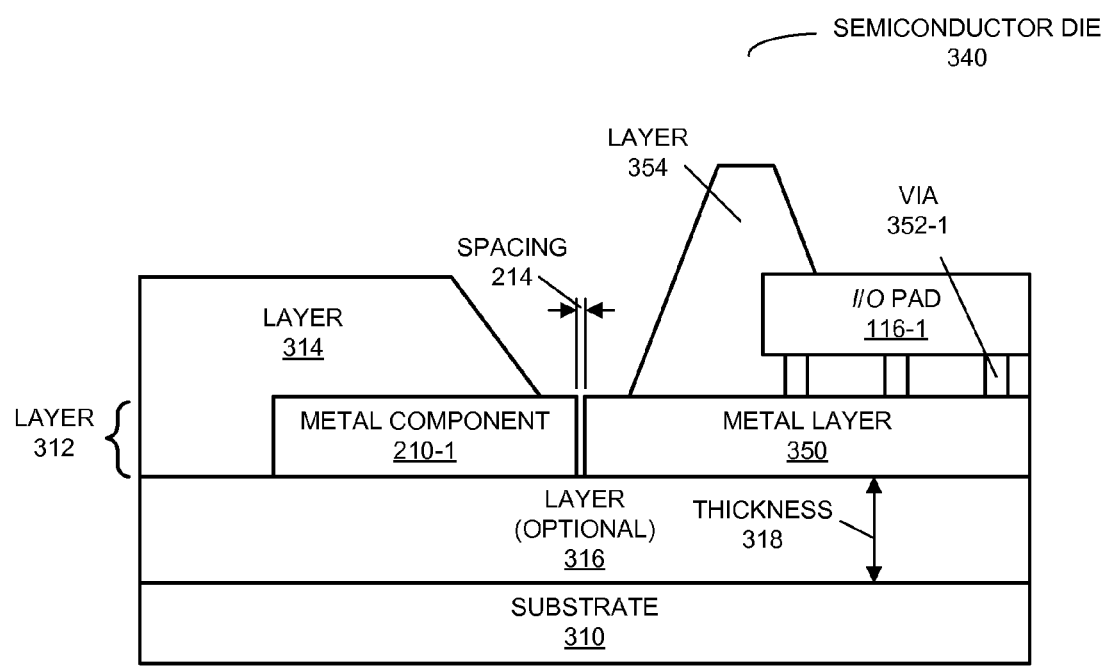
FIG. 3C is a block diagram illustrating a semiconductor die in accordance with an embodiment of the present disclosure.

In some semiconductor fabrication processes, having an open passivation cut across an edge of a top layer metal or having a large top-layer metal edge-to-edge spacing (for example, 5 µm) may not be allowed. This problem may be overcome by requesting exemptions for the passivation-cut restrictions and/or by requesting smaller edge-to-edge spacings. Alternatively, the so-called 'fuse' layout structure, which is typically available in many semiconductor processes, may be used. In a fuse layout structure, a lower layer of metal (typically one or two layers down from the top layer) is exposed by etching the passivation layers in addition to the oxide layers covering the fuse metal. This may be useful because the fuse layout rules typically allow for smaller gaps between metal wires than the top layer metal. A cross-sectional view of such a semiconductor die 340 is shown in FIG. 3C. In this semiconductor die, a lower metal layer, metal layer 350, and metal component 210-1 provide the ESD gap. Furthermore, metal layer 350 is electrically coupled to I/O pad 116-1 by vias, such as via 352-1.

Note that an ESD event may have a wide range of possible voltages and energies. Clearly, protecting a semiconductor die from the highest voltage and energy is desirable, but this is usually traded off against the cost of that protection. The cost comes in the form of the area of the ESD devices, their structures and the associated parasitic capacitance (and, hence, the bandwidth reduction and power consumption). A number of standard ESD events are defined that provide useful protection goals without too much cost. Two example ESD events are the machine model (MM) and human body model (HBM). A MM ESD event is a 200 pF capacitor, charged to a few hundred volts to a few kilo-volts, which is instantaneously coupled to the I/O pads in series with a 750 nH inductor and a 1Ω resistor. The human body model is a 100 pF capacitor, charged to 1 to 10 kV, which is instantaneously coupled to the I/O pad in series with a 7.5 uH inductor and a 1.5 kΩ resistor. Because of the significantly higher resistance and inductance in the MM, ESD-protection circuits typically withstand about a ten-times higher ESD charging voltage in this ESD event.

To address the range of possible voltages and energies in ESD events, and given the layout constraints and the desired protection levels, a semiconductor die may include different ESD devices for some of the I/O pads. Furthermore, if a supply rail is close to a group of I/O pads, and a different supply rail is close to other I/O pads, the supply rails may have additional ESD device(s) between them that provide a transient discharge path for I/O pads that have their protection via different supply rails. Note that in these embodiments there may be more than two ESD devices in series in the discharge path between any pair of I/O pads. Consequently, the effective pad-to-pad voltage or turn-on voltage of the ESD gaps in the two or more ESD devices may be increased, which may reduce the ESD protection for these I/O pads. This may be mitigated by selecting a different turn-on voltage for these ESD devices during design.

A variety of techniques may be used to select the turn-on voltage of a given ESD device. For example, the turn-on voltage of a given ESD device may be selected or modified by including an optional layer 316 (such as a dielectric) in semiconductor dies 300 (FIG. 3A), 320 (FIG. 3B) and/or 340. Space charge in this optional dielectric may modify Paschen's curve. Thus, the turn-on voltage of a given ESD device may be selected by changing: a gas in the ESD gap, a thickness 318 of optional layer 316, a dielectric constant of optional layer 316, and/or spacing 214. In some embodiments, the turn-on voltage of a given ESD device may be in one of at least two ranges of voltages, which are separated by a threshold voltage. Note that in embodiments with multiple ESD devices, a size of the given ESD device may correspond to the turn-on voltage so that the given ESD device doesn't melt during an ESD event.

Figure 4:
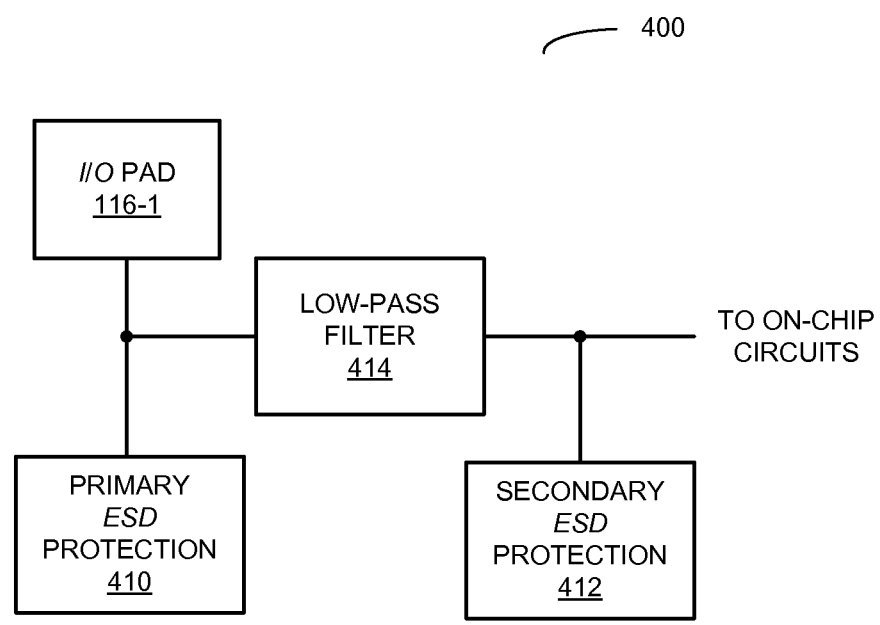
FIG. 4 is a block diagram illustrating two-stage ESD protection in accordance with an embodiment of the present disclosure.

We now describe ESD-protection circuits that include one or more ESD devices. FIG. 4 presents a block diagram 400 illustrating two-stage ESD protection, which includes primary ESD protection 410 and secondary ESD protection 412 that are electrically coupled by low-pass filter 414.

Figure 5:
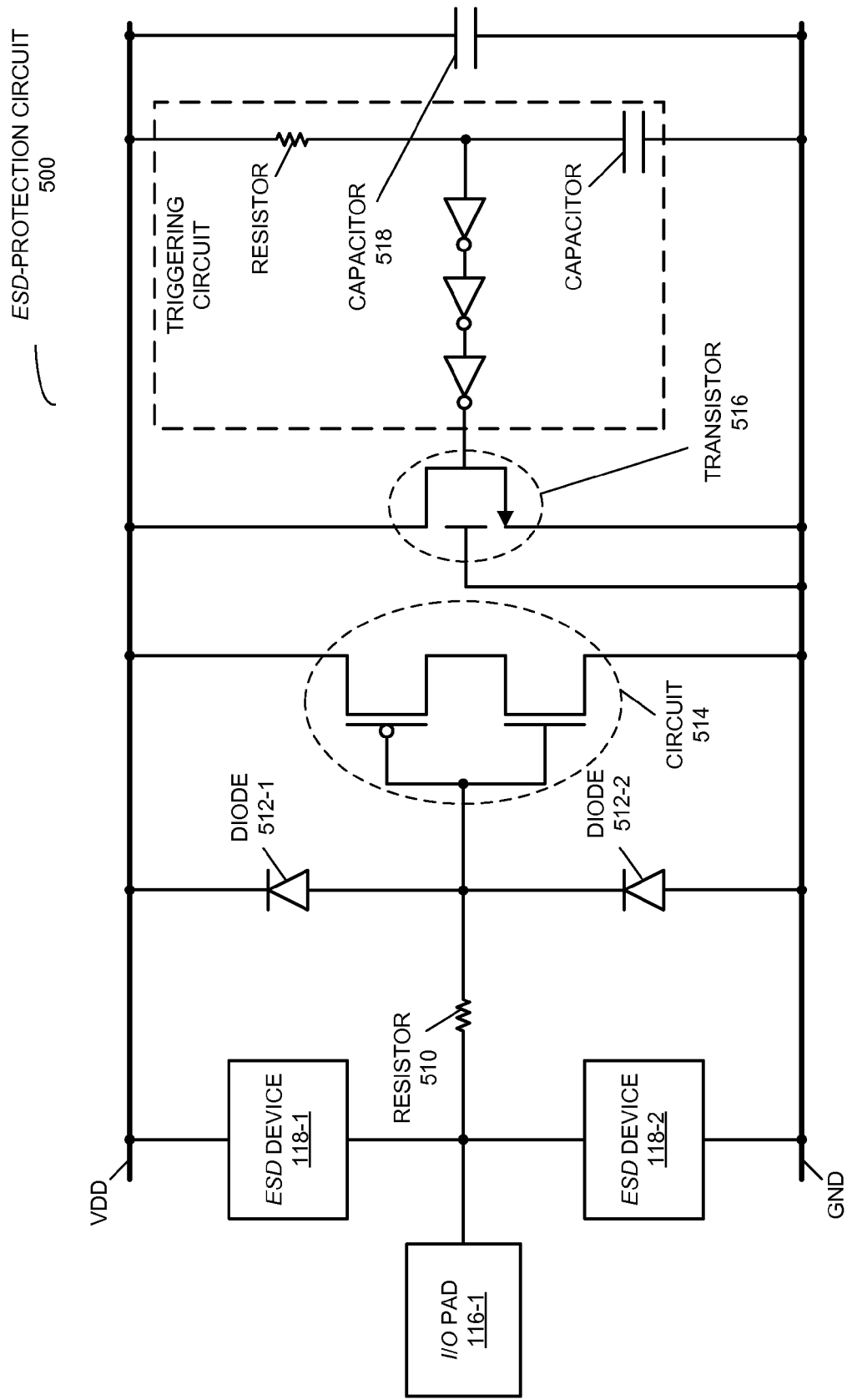
FIG. 5 is a block diagram illustrating a two-stage ESD-protection circuit in accordance with an embodiment of the present disclosure.

An example of such an ESD-protection approach is shown in FIG. 5, which presents a block diagram illustrating a two-stage ESD-protection circuit 500. In this ESD-protection circuit, ESD devices 118 form the primary ESD structure for circuit 514, and diodes 512 form the secondary ESD structure. Moreover, resistor 510, which electrically couples the primary ESD structure and the secondary ESD structure, in conjunction with the parasitic capacitance provides the low-pass filter.

The intent of the primary ESD structure is to reduce a sub-nanosecond multi-thousand-volt ESD event on I/O pad 116-1 to a few hundred volts at resistor 510. Moreover, the low-pass filter slows the edge of the ESD event to over a number of nanoseconds. Finally the intent of the secondary ESD structure is to prevent sensitive on-chip circuits (such as circuit 514) from experiencing more than a few volts. Note after passing through ESD device 118-1 and/or diode 512-1, the ESD current may be electrically coupled to ground via transistor 516 or capacitor 518. Furthermore, note that a given ESD device (such as ESD device 118-1) may have a lower capacitance than a given diode (such as diode 512-1).

Given this division of labor, the primary ESD structure dissipates most of the ESD event energy. Consequently, in existing ESD-protection circuits the primary ESD structure has the largest cost in terms of area and parasitic capacitance. By replacing the semiconductor devices (such as diodes) in the primary ESD structure with ESD devices 118, ESD-protection circuit 500 may offer improved protection with reduced parasitic capacitance.

Note that Paschen's curve shows that the gaseous-breakdown effect in air corresponds to a breakdown voltage of around 330 V plus 3 V/μm for the ESD gap. However, this curve is only valid for air gaps larger than 5 μm. The lesser known modified Paschen's curve indicates that, for air gaps smaller than 5 μm, the adjacent metal edges begin to conduct via the field-emission effect. This effect has a smoother turn-on transient than gaseous breakdown of air. For these small gaps, the field emission turns on and conducts significant current for a threshold voltage of approximately 75 V/μm for the ESD gap. Therefore, if the spacing of the ESD gap in an ESD device is kept to under a few microns, it can serve the function of the primary ESD structure and can reduce a multi-thousand-volt ESD event to a few hundred volts. Because it may be difficult to reduce the ESD event to a few volts, given typical minimum lithographic metal-to-metal spacing in high-layer metals, ESD-protection circuit 500 may include the low-pass filter and the secondary ESD structure for further reduction to a few volts. However, as noted previously, the turn-on voltage of a given ESD device may be selected during design. If the resulting turn-on voltage is small enough, the low-pass filter and/or the secondary ESD structure may be removed.

The semiconductor dies in the preceding embodiments may be included in corresponding chip packages. A given chip package may include: a ceramic housing, encapsulation, and connectors or pins for electrical coupling to other components. Furthermore, the resulting chips may include: an application-specific integrated circuit (ASIC), a digital signal processor (DSP), a processor, memory, graphics, a switch, and/or an integrated circuit that includes an I/O circuit.

Figure 6:
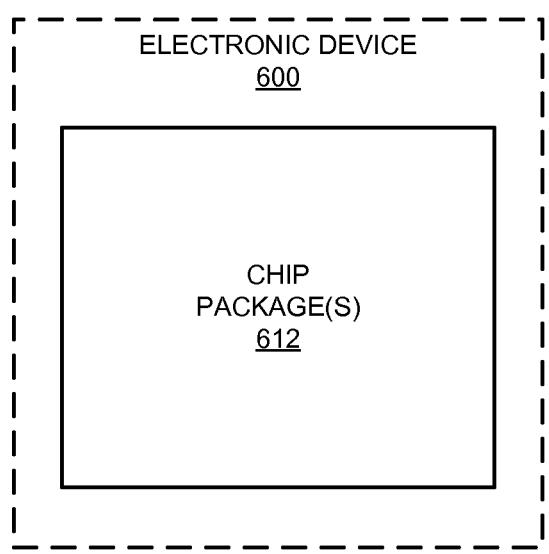
FIG. 6 is a block diagram illustrating an electronic device that includes one or more chip packages in accordance with an embodiment of the present disclosure.

We now describe embodiments of an electronic device and a computer system. FIG. 6 presents a block diagram illustrating an electronic device 600 that includes one or more chip packages 612, such as a chip package that includes semiconductor die 110-1 (FIG. 1A) or semiconductor die 110-2 (FIG. 1B). Electronic device 600 may include a wide variety of devices that use integrated circuits, such as: a cellular phone, a PDA, a portable electronic device, a consumer-electronic device, and/or industrial electronics. In some embodiments, electronic device 600 includes a computer system.

Figure 7:
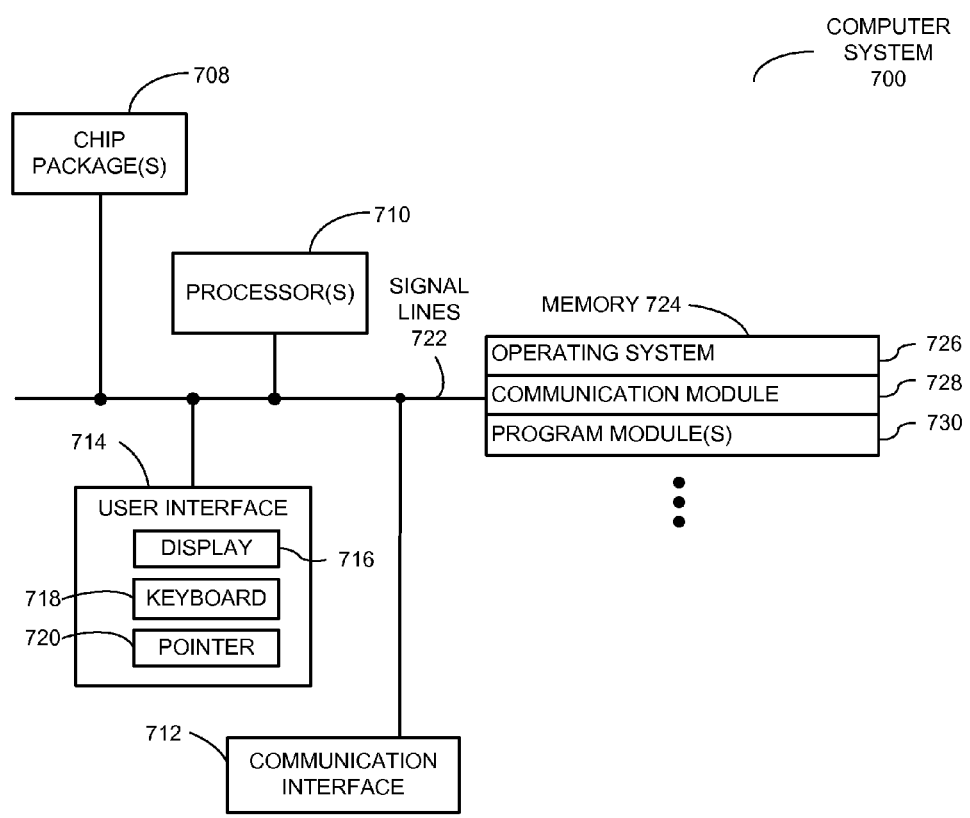
FIG. 7 is a block diagram illustrating a computer system that includes one or more chip packages in accordance with an embodiment of the present disclosure.

FIG. 7 presents a block diagram illustrating a computer system 700 that includes one or more chip packages 708, such as a chip package that includes semiconductor die 110-1 (FIG. 1A) or semiconductor die 110-2 (FIG. 1B). Computer system 700 includes: one or more processors (or processor cores) 710, a communication interface 712, a user interface 714, and one or more signal lines 722 coupling these components together. Note that the one or more processors (or processor cores) 710 may support parallel processing and/or multi-threaded operation, the communication interface 712 may have a persistent communication connection, and the one or more signal lines 722 may constitute a communication bus. Moreover, the user interface 714 may include: a display 716, a keyboard 718, and/or a pointer 720, such as a mouse.

Memory 724 in the device 700 may include volatile memory and/or non-volatile memory. More specifically, memory 724 may include: ROM, RAM, EPROM, EEPROM, flash, one or more smart cards, one or more magnetic disc storage devices, and/or one or more optical storage devices. Memory 724 may store an operating system 726 that includes procedures (or a set of instructions) for handling various basic system services for performing hardware-dependent tasks. Moreover, memory 724 may also store communications procedures (or a set of instructions) in a communication module 728. These communication procedures may be used for communicating with one or more computers, devices and/or servers, including computers, devices and/or servers that are remotely located with respect to the device 700.

Memory 724 may also include one or more program modules 730 (or a set of instructions). Note that one or more of program modules 730 may constitute a computer-program mechanism. Instructions in the various modules in the memory 724 may be implemented in: a high-level procedural language, an object-oriented programming language, and/or in an assembly or machine language. The programming language may be compiled or interpreted, i.e., configurable or configured, to be executed by the one or more processors (or processor cores) 710.

Computer system 700 may include, but is not limited to: a server, a laptop computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Note that computer system 700 may be at one location or may be distributed over multiple, geographically dispersed locations.

Semiconductor die 110-1 (FIG. 1A), semiconductor die 110-2 (FIG. 1B), semiconductor die 200 (FIG. 2A), semiconductor die 220 (FIG. 2B), semiconductor die 240 (FIG. 2C), semiconductor die 260 (FIG. 2D), semiconductor die 280 (FIG. 2E), semiconductor die 300 (FIG. 3A), semiconductor die 320 (FIG. 3B), semiconductor die 340 (FIG. 3C), ESD-protection circuit 500 (FIG. 5), electronic device 600 (FIG. 6) and/or computer system 700 may include fewer components or additional components. Moreover, although these components, circuits and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

Note that some or all of the functionality of electronic device 600 (FIG. 6) and/or computer system 700 may be implemented in one or more ASICs and/or one or more DSPs. Furthermore, functionality in the preceding embodiments may be implemented more in hardware and less in software, or less in hardware and more in software, as is known in the art. Additionally, the circuits in the preceding embodiments may be implemented using: complementary metal-oxide-semiconductor (CMOS) transistors, n-type MOS (NMOS) transistors, p-type MOS (PMOS) transistors, and/or bipolar junction transistors.

While the preceding embodiments uses semiconductor dies 110 (such as silicon), in other embodiments a different material than a semiconductor may be used as the substrate material.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A chip package, comprising:
   a semiconductor die, wherein the semiconductor die includes:
      a substrate;
      a first layer, deposited on the substrate, which includes an ESD device with at least a metal component coupled to an I/O pad and coupled to a ground voltage via a signal line, wherein adjacent edges of the metal component and the I/O pad are separated by a spacing that defines an ESD gap, and wherein, when field-emission or ionization current flows across the ESD gap, the metal component provides a discharge path to the ground voltage for transient ESD signals; and
      a second layer, deposited on the first layer, that at least partially encloses the ESD gap between the metal component and the I/O pad, thereby providing a gas in the ESD gap.

2. The chip package of claim 1, wherein a surface of the second layer and a surface of the substrate define a cavity that fully encloses the ESD gap.

3. The chip package of claim 1, wherein a gas in the cavity is other than air.

4. The chip package of claim 1, wherein the second layer includes an opening defined in part by a surface of the second layer that exposes the ESD gap to the gas.

5. The chip package of claim 1, wherein at least one of the adjacent edges has an arrow shape in a plane of the first layer.

6. The chip package of claim 1, wherein the adjacent edges both have an arrow shape in a plane of the first layer; and wherein the spacing that defines the ESD gap is between tips of the arrow-shaped adjacent edges.

7. The chip package of claim 1, further comprising a third layer between the substrate and the first layer which is underneath at least the ESD gap.

8. The chip package of claim 7, wherein the third layer includes a dielectric.

9. The chip package of claim 1, further comprising multiple ESD devices in the first layer, wherein the metal component in a given one of the ESD devices is coupled to a corresponding I/O pad and is coupled to the ground voltage via the signal line.

10. The chip package of claim 9, wherein the ESD devices are arranged in a 2-dimensional array in the first layer.

11. The chip package of claim 9, wherein the ESD devices are arranged in a 1-dimensional array along the signal line in the first layer.

12. The chip package of claim 9, wherein a turn-on voltage of the given ESD device is in one of at least two ranges of voltages, which are separated by a threshold voltage.

13. The chip package of claim 12, wherein a size of the given ESD device corresponds to the turn-on voltage.

14. The chip package of claim 1, further comprising an ESD diode which is coupled in parallel with the ESD device.

15. The chip package of claim 14, further comprising a low-pass filter that couples the ESD device and the ESD diode.

16. The chip package of claim 14, wherein the ESD device has a lower capacitance than the ESD diode.

17. An electronic device, comprising a chip package, wherein the chip package includes a semiconductor die, and wherein the semiconductor die includes:
   a substrate;
   a first layer, deposited on the substrate, which includes an ESD device with at least a metal component coupled to an I/O pad and coupled to a ground voltage via a signal line, wherein adjacent edges of the metal component and the I/O pad are separated by a spacing that defines an ESD gap, and wherein, when field-emission or ionization current flows across the ESD gap, the metal component provides a discharge path to the ground voltage for transient ESD signals; and
   a second layer, deposited on the first layer, that at least partially encloses the ESD gap between the metal component and the I/O pad, thereby providing a gas in the ESD gap.

18. The electronic device of claim 17, wherein a surface of the second layer and a surface of the substrate define a cavity that fully encloses the ESD gap.

19. The electronic device of claim 17, wherein a gas in the cavity is other than air.

20. The electronic device of claim 17, wherein the second layer includes an opening defined in part by a surface of the second layer that exposes the ESD gap to the gas.

* * * * *